US006961887B1

(12) United States Patent
Coldiron, Sr.

(10) Patent No.: US 6,961,887 B1
(45) Date of Patent: Nov. 1, 2005

(54) STREAMLINED LASAR-TO-L200 POST-PROCESSING FOR CASS

(75) Inventor: Gary L. Coldiron, Sr., Bloomington, IN (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 650 days.

(21) Appl. No.: 09/971,907

(22) Filed: Oct. 9, 2001

(51) Int. Cl.$^7$ .......................... G01R 31/28; G06F 11/00
(52) U.S. Cl. .................................................... 714/741
(58) Field of Search ....................... 714/724, 734–739, 714/741, 745; 324/158

(56) References Cited

U.S. PATENT DOCUMENTS

| | | | | |
|---|---|---|---|---|
| 4,348,760 A | * | 9/1982 | Rice et al. | 714/734 |
| 4,727,545 A | * | 2/1988 | Glackemeyer et al. | 714/33 |
| 4,996,688 A | | 2/1991 | Byers et al. | 371/16.5 |
| 5,184,308 A | | 2/1993 | Nagai et al. | 364/489 |
| 5,189,365 A | | 2/1993 | Ikeda et al. | 324/158 |
| 5,371,851 A | * | 12/1994 | Pieper et al. | 345/501 |
| 5,475,624 A | | 12/1995 | West | 364/578 |
| 5,596,587 A | | 1/1997 | Douglas et al. | 371/27 |
| 5,633,812 A | | 5/1997 | Allen et al. | 364/578 |
| 5,663,967 A | | 9/1997 | Lindberg et al. | 371/26 |
| 5,802,348 A | | 9/1998 | Stewart et al. | 395/500 |
| 6,141,630 A | | 10/2000 | McNamara et al. | 704/14 |
| 6,202,044 B1 | | 3/2001 | Tzori | 703/28 |

OTHER PUBLICATIONS

Steven D. Millman, Edward J. MxCluskey, John M. Acken; Diagnosing CMOS Bridging Faults with Stuck-at Fault Dictionaries; 1990 IEEE; 1990 International Test Conference; pp. 860-870.*

West C. M., Next Generation Test Generator (NGTG) Interface to Automatic Test Equipment (ATE) for Digital Circuits, Sep. 22-25, 1997, 1997 IEEE Autotestcon Proceedings, pp. 126-128.*

Pestana, P.A., Making the Bridge Between Two Worlds-Post-Processing LASAR Data Into a Test Language, Sep. 16-19, 1996, IEEE, pp. 223-230.*

Wedge, G., Using Boundary scan With a Fault Dictionary to Test and Diagnose Clusters of Non-Scan Logic, Sep. 16-19, 1996, IEEE, pp. 400-404.*

* cited by examiner

Primary Examiner—Guy Lamarre
Assistant Examiner—John J. Tabone, Jr.
(74) Attorney, Agent, or Firm—Mark Homer

(57) ABSTRACT

A technique of generation of a job for a digital testing unit for a test station from a circuit simulation unit includes completing fault simulation on electronic circuitry, then executing a first program without a fault dictionary, generating a pin map of the electronic circuitry and appending any pin groups, generating test vectors using the pin groups by the first program, generating additional pin groups to accommodate any orphan pins, converting the pin maps and pattern files to pin maps and pattern files, executing the first program to generate the fault dictionary, inputting a minimum scope level of analysis of the circuitry, generating the fault dictionary in fault dictionary data files according to the minimum scope level, generating a fault retriever file from the first program; and transporting the fault dictionary data files, test vectors, new pin maps, and fault retriever file to a second program for run-time fault analysis on the electronic circuitry testing unit. Wire path files and test vectors are generated. The scoring of a mismatch between predicted test responses and actual tester responses can be done by assigning a partial credit for primary output patterns being detected.

16 Claims, 12 Drawing Sheets

```
! WIRE-PATH FILE FOR UEU IDST LASAR RUN
! JULY 14, 1999
! CREATED BY:  GARY COLDIRON
!
PAGE SECTION:

! Format - PIN NAME:[PAGE NO. STRING, 28 CHARS MAX]/. . .
! (no brackets)

P1:2,7/P2:2 - 7/P3:2,7/P4:2,7/P5:3,10/P6:3,10/P7:1,4/P8:1 - 4/P9:2,7/
P10:2,7/P11:2,8/P12:2,8/P13:3,10/P14:3,10/P15:1,4/P16:1,4,6/P17:1,4/
P18:1,4/P19:3,10/P20:3,10/P21:1,5,6/P22:1,5,6/P23:3,10/P24:3,10/
P25:35,36/P26:35,36/P27:35,36/P28:35,36/P29:35,36/
P30:35,36/P31:35,36/P32:35,36/P33:35,36/P34:35,36/P35:38,50/
P36:38,50/P37:14,46/P38:14,46/P39:14,46/
P40:14,46/P41:14,46/P42:14,46/P43:14,46/P44:14,46/P45:14,46/
P46:14,46/P47:14,46/P48:14,46/P49:14,46/
P50:14,46/P51:14,46/P52:14,46/P53:17,46/P54:17,46/P55:17,46/
. . . .

WIRE SECTION:

! Format - <Pin ID>   must use angle brackets
!          Conn/wire info line 1 (40 chars max)
!          Conn/wire info line 2
!          Etc.
<P15>
A1A1:P1A-11
<P16>
A1A1:P1A-12
<P21>
A1A1:P1A-13
<P22>
A1A1:P1A-14
<P7>
A1A1:P1C-11
<P8>
A1A1:P1C-12
<P17>
A1A1:P1C-13
. . . .
```

Fig. 6

```
000100 BEGIN, ATLAS PROGRAM 'IDST'      $
000200 INCLUDE, NON-ATLAS MODULE 'L2_INIT'          $
    10 INCLUDE, NON-ATLAS MODULE 'L2_EXECUTE'       $
    20 INCLUDE, NON-ATLAS MODULE 'L2_GO_AWAY'       $
    30 INCLUDE, NON-ATLAS MODULE 'ATG_FLT_L'        $

C      +----------------------------+
       |   VARIABLE DECLARATIONS    |
       +----------------------------+
                                                    $
002000 DECLARE, INTEGER, LIST, 'RESULT-DATA'(100), 'EX-DATA'(20),
          'HOLD_QTY'(5), 'HOLD_SCR'(5), 'FAULTSETS'(100)          $
    10 DECLARE, LONG-INTEGER, STORE, 'QTY-RET', 'QTY-PINS', 'QTY-PATTS',
          'REQ-CONTEXT'                                           $
    20 DECLARE, BOOLEAN, STORE, 'ASYNCFLAG', 'TEST-FAILED', 'DTU_INIT'  $
    30 DECLARE, MSGCHAR, STORE, 'TESTNUM', 'PORF', 4 CHAR          $
    40 DECLARE, MSGCHAR, LIST, 'PRNT_STR'(200), 'NEWS'(5), 'PATHS'(50),
              40 CHAR                                              $

004000 DEFINE, 'ATG_FLT_L', EXTERNAL, PROCEDURE('FD_NAME', 'WP_NAME')
          RESULT('QTY', 'SCORE', 'PRNTSTR', 'NEWS', 'FLTSETS', 'PATHS')  $
    05 DECLARE, INTEGER, LIST, 'QTY'(5), 'SCORE'(5), 'FLTSETS'(100) $
    10 DECLARE, MSGCHAR, STORE, 'FD_NAME', 'WP_NAME', 18 CHAR       $
    15 DECLARE, MSGCHAR, LIST, 'PRNTSTR'(200), 'NEWS'(5),
              'PATHS'(50), 40 CHAR                                  $
    90 END, 'ATG_FLT_L'    $
```

Fig. 7(a)

```
009200 DEFINE, 'SHOW_ATG_FAIL', PROCEDURE (('P-O', 'WP')        $
    10  DECLARE, MSGCHAR, STORE, 'HOLD', 40 CHAR   $
    15  DECLARE, INTEGER, STORE, 'I', 'J', 'K', 'L', 'P-C', 'MAX-SCR',
            'LAST-GRP', 'WP'                                   $
    20  OUTPUT, USING 'CRT',
            ((5X))
            ((5X,'+-----------------------------------------------+'))
            ((5X,'|  < A4 TEST PROG HAS FAILED >',24X,'|'))
            ((5X,'|',53X,'|'))
            ((5X,'|  TEST SECTION:  ATG <LASAR>',25X,'|'))
            ((5X,'|  TEST NUMBER:   0511',33X,'|'))
            ((5X,'|  DEVICE TESTED: BOARDS A1A1 & A1A2',17X,'|'))
            ((5X,'|',53X,'|'))
            ((5X,'|  FAULT SEARCH RESULT:',31X,'|'))
            ((5X,'|         ',A40,6X,'|')'NEWS'(1))            $
    30  IF, 'HOLD_SCR'(1) EQ 0, THEN         $
    32      CALCULATE, 'MAX-SCR' = 50        $
    34  ELSE        $
    36      CALCULATE, 'MAX-SCR' = 80        $
    38  END, IF     $
    40  FOR, 'I' = 1 THRU 4, THEN            $
    42      IF, 'HOLD_SCR'('I') GT 'MAX-SCR', THEN   $
    44          CALCULATE, 'LAST-GRP' = 'I' - 1      $
    46          LEAVE, FOR   $
    48      END, IF     $
    50  END, FOR    $
    60  IF, 'HOLD_SCR'(1) GE 0, THEN                 $
    65      FOR, 'J' = 1 THRU 'HOLD_QTY'(1), THEN    $
    70          OUTPUT, USING 'CRT',
                ((5X,'|',4X,A40,9X,'|')'PRNT_STR'('J'))   $
    75      END, FOR, 'J'   $
    80  END, IF    $

85  OUTPUT, USING 'CRT',
            ((5X,'|',53X,'|'))
            ((5X,'|',3X,'MISMATCH = ',I3,36X,'|')'HOLD_SCR'(1))
            ((5X,'+-----------------------------------------------+'))
            ((5X,'<<< HIT THE CTU ICON TO SHOW NEXT FAULTSET >>>'))
            $
    90  WAIT FOR, MANUAL INTERVENTION    $
    95  CALCULATE, 'L' = 'HOLD_QTY'(1)   $
009300  FOR, 'I' = 2 THRU 'LAST-GRP', THEN       $
    05      IF, 'HOLD_SCR'('I') GE 0, THEN       $
    10          OUTPUT, USING 'CRT',
                ((5X))
                ((5X,'+-----------------------------------------------+'))
                ((5X,'|  FAULTSET NO. ',I1,37X,'|')'I')
                ((5X,'|',53X,'|'))    $
    15          FOR, 'J' = 1 THRU 'HOLD_QTY'('I'), THEN    $
    20              CALCULATE, 'L' = 'L' + 1     $
    25              OUTPUT, USING 'CRT',
                    ((5X,'|',4X,A40,9X,'|')'PRNT_STR'('L'))    $
    30          END, FOR, 'J'   $
    35          OUTPUT, USING 'CRT',
                ((5X,'|',53X,'|'))
                ((5X,'|',3X,'MISMATCH = ',I3,36X,'|')'HOLD_SCR'('I'))
                ((5X,'+-----------------------------------------------+'))
                ((5X,'<<< HIT THE CTU ICON TO SHOW NEXT FAULTSET >>>'))
                $
    40          WAIT FOR, MANUAL INTERVENTION    $
    45      ELSE    $
    50          LEAVE, FOR   $
    55      END, IF    $
    60  END, FOR, 'I'    $
```

Fig. 7(b)

```
       65  IF, 'WP' GT 0, THEN       $
       70      IF, 'HOLD_QTY'(5) GT 0, THEN      $
       75          OUTPUT, USING 'CRT',
            ((5X))
            ((5X,'+----------------------------------------------------+'))
            ((5X,'|    ** SUPPLEMENTARY I/O DATA FOR ATG **',13X,'|'))
            ((5X,'|',53X,'|'))          $
       80          FOR, 'I' = 1 THRU 'HOLD_QTY'(5), THEN     $
       85              OUTPUT, USING 'CRT',
                          ((5X,'|',4X,A40,9X,'|')'PATHS'('I'))     $
       90          END, FOR, 'I'    $
       95          OUTPUT, USING 'CRT',
            ((5X,'|',53X,'|'))
            ((5X,'+----------------------------------------------------+'))
            ((5X,'<<< HIT THE CTU ICON TO CONTINUE >>>'))
            $
009400          WAIT FOR, MANUAL INTERVENTION       $
   05       END, IF    $
   10   END, IF    $
   15   IF, 'P-O' GT 0, THEN    $
   20      OUTPUT, USING 'PRT',
              . . . .
            $
   85   END, IF    $
   90 END, 'SHOW_ATG_FAIL'       $

050000 PERFORM, 'CLR_DSPLY'    $
   10   OUTPUT, USING 'CRT',
            +----------------------------------------------------+
            |           * UUT ID COMPLETE LASAR/L200 TEST *       |
            |                                                     |
            |    > USING L200 <id.lasar>'atg_patts' TO TEST ID A1 |
            +----------------------------------------------------+
            $
   20   CALCULATE, 'TESTNUM'=C'0500'      $
   30   CALCULATE, 'L200-PROC' = C'<id.lasar>atg_patts'   $
   40   IF, NOT 'DTU_INIT', THEN    $
   50     PERFORM, 'L2_INIT',C'TPS_EXE', C'ID', C'LASAR', 0, FALSE,
            'REQ-CONTEXT'                 $
   60     CALCULATE, 'DTU_INIT' = TRUE     $
050100 END, IF   $
   10  PERFORM, 'L2_EXECUTE', C'atg_patts', FALSE, 0, TRUE, 'EX-DATA',
         'REQ-CONTEXT', 'TEST-FAILED', 'RESULT-DATA'        $
   20  IF, 'TEST-FAILED', THEN    $
   30    OUTPUT, USING 'CRT', ----------------------------------------------------+
            |              <<<  UUT FAILURE  >>>                 |
            |                                                    |
            |    LASAR PROGRAM 'atg_patts' HAS DETECTED A FAULT. |
            +---------------------------------------------------+
            $
   40    PERFORM, 'ATG_FLT_L', C'FAULT_D.DAT', C'WIRE_PTH.DAT', 'HOLD_QTY',
            'HOLD_SCR', 'PRNT_STR', 'NEWS', 'FAULTSETS', 'PATHS'      $
   50    PERFORM, 'SHOW_ATG_FAIL', 1, 1        $
   60  ELSE     $
   70    OUTPUT, USING 'CRT', ---------------------------------------
                  LASAR & L200 TESTING PASSED.
            ---------------------------------------

$
   80  END, IF    $
E999900 FINISH    $
   10 TERMINATE, ATLAS PROGRAM 'IDST'    $
```

Fig. 7(c)

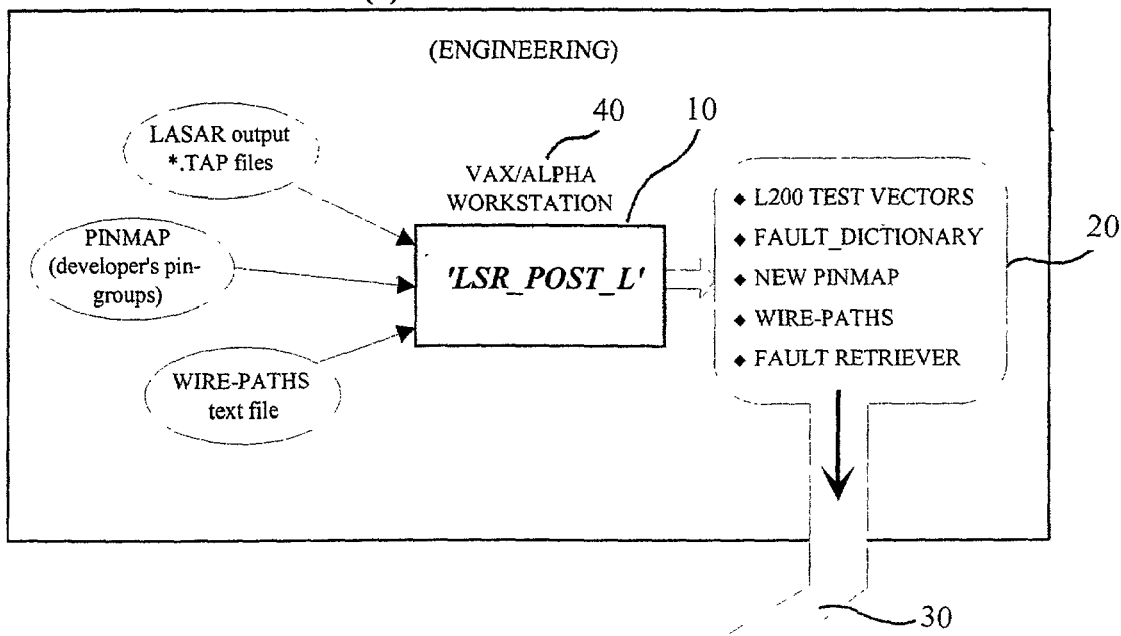
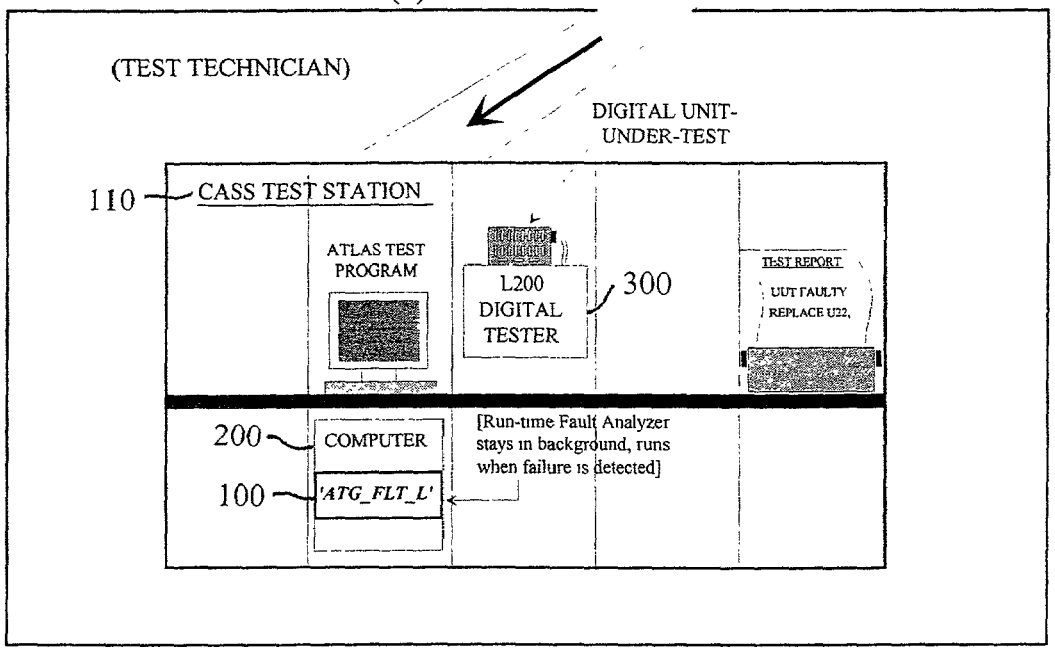
Fig. 10

STREAMLINED LASAR-TO-L200 POST-PROCESSING FOR CASS

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

1. Field of the Invention

The present invention relates to a technique for the interfacing of a circuit simulation unit and a circuit testing unit, and more particularly, to streamlining circuit simulation output into data for an automated circuit testing program of a circuit testing device.

2. Description of the Background Art

Currently there is a use of automatic test stations (ie., CASS for consolidated automatic support system test stations) to test electronic circuitry found in many different devices such as avionic devices. The test station hosts a digital test instrument such as the L200 by TERADYNE to handle all of the digital device testing. Digital test developers must use a high-level program (ie., LASAR) to create generic test vectors for very complex digital circuits. LASAR is a digital circuit simulator (program) with fault simulation capability. A test engineer will develop models of a digital circuit using LASAR, provide it with stimulus which he wants to inject into the board, then debug and analyze the circuit using LASAR's screen output capability. Once the test stimuli are performing correctly, the developer will use LASAR to simulate real world fault conditions. LASAR will then create "snapshots" of these fault conditions which can be compared to fault-free output following a real world test. These snap-shots are to be collected into a file, much like a database, called a fault dictionary. The fault dictionary must be tailored for the particular tester that will be used to test the digital board.

The CASS test station is equipped with an instrument called the DTU (Digital Test Unit). It is the instrument which tests digital circuitry. While the CASS, in general, uses ATLAS, the DTU has its own unique language called L200. Digital test code must be written in the L200 language to be used at run-time by the CASS test station. Some method is needed to convert LASAR output to L200 test code.

The standard method to generate a complete L200 test job for CASS using LASAR output is cumbersome, unwieldy, and is a path fraught with error. Test vectors generated are anything but readable, even on jobs with a small number of patterns, because only pin state changes are shown. The method does not work very well with hierarchical model design such as one would employ to test a box, an Interface Device (ID), for example. Often the test engineer needs to build two or more nets and combine them into one large model. LASAR permits this feature but post-processing into L200 is difficult if not prohibitive. The L200 post-processor does not allow names of chips to exceed four characters which precludes the use of scoping type fault callouts required by hierarchical modeling.

Furthermore, the standard 9-9-1 mismatch scoring algorithm is simply not adequate in some situations. The 9-9-1 weighting factor method of mismatch scoring sometimes punishes the real fault signature too severely by overlooking valid matches. A typical 9-9-1 mismatch scoring fault analyzer had much difficulty producing accurate fault callouts for the signatures represented in the fault dictionary. Some of the faults were totally erroneous and directed the technician to replace many good components while never touching the actual faulty one. Apparently, the correct fault signature was scored for mismatch too punitively. Analysis revealed that the correct POPATs (primary output patterns) found were not given adequate credit. Furthermore, the 9-9-1 method has great difficulty handling anomalies such as multiple faults or poor initialization.

SUMMARY OF THE INVENTION

It is therefore an object to increase the efficiency of converting the output of circuit simulation data into data for automated circuit testing program of a circuit testing device.

It is another object to have programs that generate readable test vectors.

It is still another object to have programs that accommodate hierarchical model structuring.

It is still yet another object to enhance the mismatch scoring algorithm.

To achieve the objectives of the present invention, there is provided a technique of generation of a job for digital testing unit for a test station from the output of a program for circuit simulation. The present invention includes completing fault simulation on electronic circuitry, then executing a first program without a fault dictionary, generating a pin map of the electronic circuitry and appending any pin groups, generating test vectors using the pin groups by the first program, generating additional pin groups to accommodate any orphan pins, converting the pin maps and pattern files to pin maps and pattern files, executing the first program to generate the fault dictionary, inputting a minimum scope level of analysis of the circuitry, generating the fault dictionary in fault dictionary data files according to the minimum scope level, generating a fault retriever file from the first program; and transporting the fault dictionary data files, test vectors, new pin maps, and fault retriever file to a second program for run-time fault analysis on the electronic circuitry testing unit.

The present invention may also generate wire path files for analysis.

The present invention may also include the scoring of a mismatch between predicted test responses and actual tester responses by assigning a partial credit for primary output patterns being detected.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 6 is the creating of the "WIRE_PATH.TXT" file for the wire-path;

FIG. 7(a) is an ATLAS header code to implement "ATG_FLT_L";

FIG. 7(b) is the beginning ATLAS code to implement ATG_FLT_L;

FIG. 7(c) is the remaining ATLAS code to implement ATG_FLT_L;

FIG. 10 is the overall scheme of the streamlined technique of LASAR to L200 conversion;

DETAILED DESCRIPTION OF THE PREFERRED EMBODIMENTS

A new system was developed in the present invention to generate the L200 job for CASS (110) from the LASAR (5) output (20). This new method greatly reduces the unwieldiness of the process, produces very readable test vectors, encourages and even enhances hierarchical model structuring, and offers a better mismatch scoring algorithm not based on the 9-9-1 weighting rule. This system is implemented in a duet software package containing the post-processor 'LSR_POST L' and the run-time fault analyzer 'ATG_FLT_L'.

First, there is a completion of a successful fault simulation in a LASAR job (S10). All LASAR simulation is completed on a computer workstation such as a DEC ALPHA workstation. The test vectors (patterns), input and output vectors are in LASAR format. Concerning the fault circuit simulation, the fault diagnostics database (fault_dictionary) is also in LASAR format.

Figure 1:
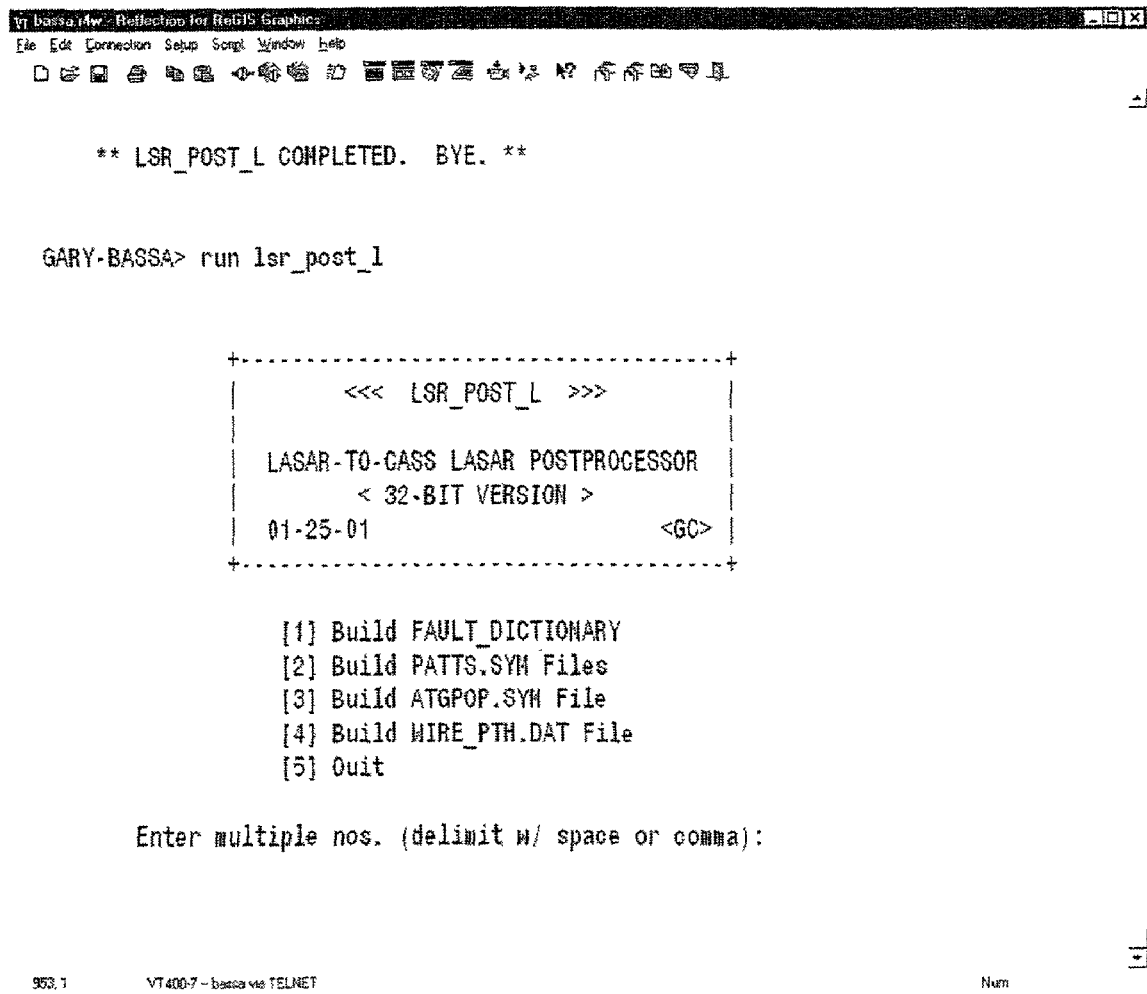
FIG. 1 is the LSR_POST_L main menu of the present invention.
Figure 2:
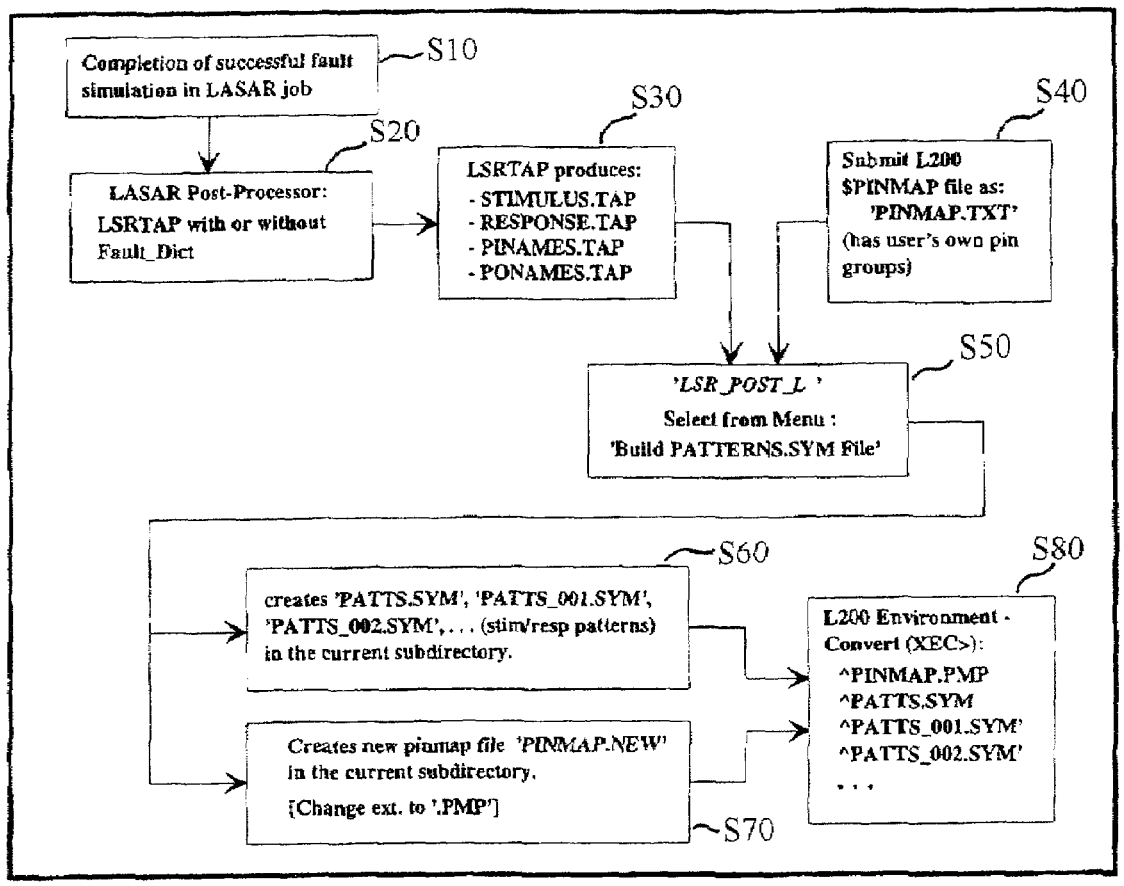
FIG. 2 is the creating of the PATTERNS files.

In the next set of steps, a test job is built on the same workstation where the simulation is completed. Referring to FIG. 2, the LSR_POST_L program is used to create L200 style pattern files. In LASAR, after all Good Machine Response (GMR) simulation results are satisfactory (S10), simply post-process using LASAR's 'LSRTAP' without fault_dictionary (S20). The LSRTAP generates .TAP files (S30). The TAP files are text file database of 1's and 0's input stream representing the states of each pin. The .TAP files are not easily readable by a user. Now the developer creates the L200 $PINMAP file and appends any pin groups that he or she wishes to see (S40). The $PINMAP file has the pin map of the simulated circuit used to perform LASAR simulation. 'LSR_POST_L' will generate test vectors using these pin groups. If no pin groups are supplied, it will create them automatically. Then a copy of the 'LSR_POST_L' program will be brought into the directory where the TAP files from the LASAR job reside. Then, bring in the $PINMAP, copy as 'PINMAP.TXT' and run 'LSR_POST_L'. At the menu options (see FIGS. 1 and 2), select the "Build PATTS.SYM Files" option (S50) to build the pattern files. 'LSR_POST_L' will create a new pinmap file, 'PINMAP.NEW' (S70), which has additional pin groups to accommodate any orphan pins. Basically the pin map file is appended with the added information. The LSR_POST_L program also creates the new (stimulus and response) pattern files ('PATTS.SYM', 'PATTS_001.SYM', 'PATTS_002.SYM', etc.) in the current subdirectory (S60). All pattern (vector) files are created by LSR_POST_L for the L200 tester. The pattern files are now enhanced as they are now readable to the developer. In L200, simply do a "convert-in" to bring the new pin map (must change name to '.PMP', of course) and new pattern files ('PATTS.SYM', 'PATTS_001.SYM', 'PATTS_002.SYM', etc.) into XEC (L200's test operating system) (S80).

Figure 3:
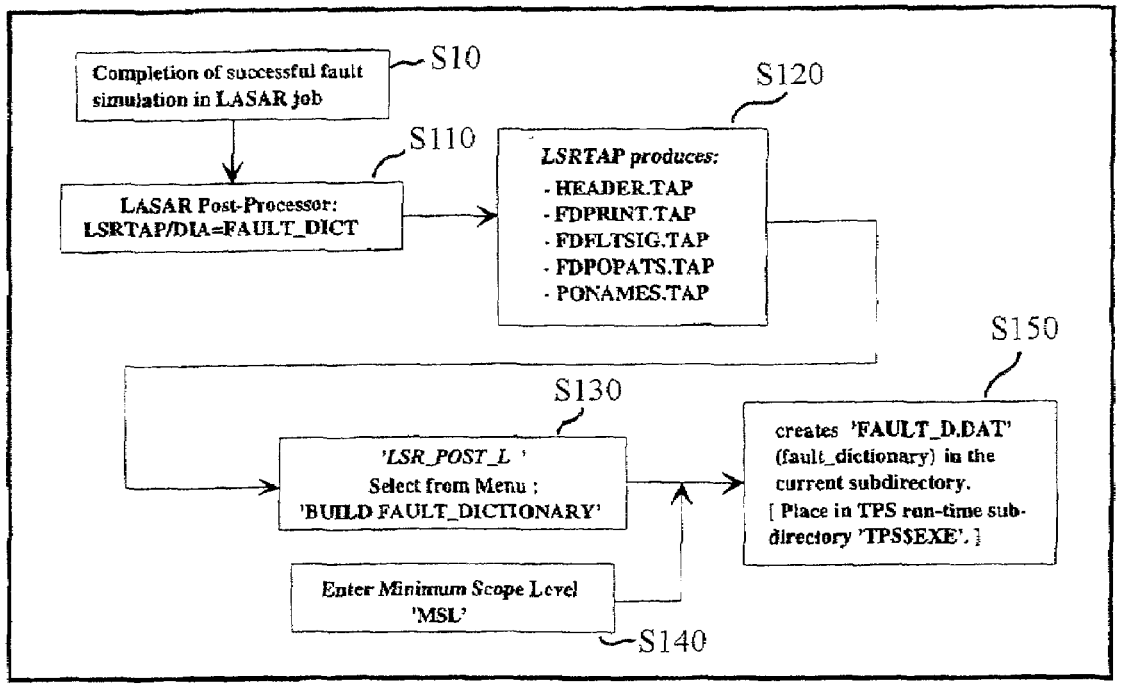
FIG. 3 is the creating of the fault dictionary.

Creating the fault dictionary is just as streamlined as seen in FIG. 3. All fault simulations are completed in LASAR (S10) and then post-process again using 'LSRTAP', this time with the /DIA=FAULT_DICT option where "/DIA" stands for diagnostics and FAULT_DICT refers to the fault dictionary (S110). The LSRTAP produces a plurality of TAP files (S120). Then, again, run the program 'LSR_POST_L' and use the option "Build FAULT_DICTIONARY" from the main menu (see FIG. 3) (S130). The user is asked to enter the Minimum Scope Level (MSL) he or she wishes to see (S140); this guarantees that the fault analyzer will always show the correct hierarchical fault call-out at run-time. The special fault dictionary file 'FAULT_D.DAT' is created (S150). This fault dictionary file will be used at run-time on the L200. This fault dictionary is not converted into the L200 environment. Instead, the fault dictionary resides in the run-time test program directory.

Figure 4:
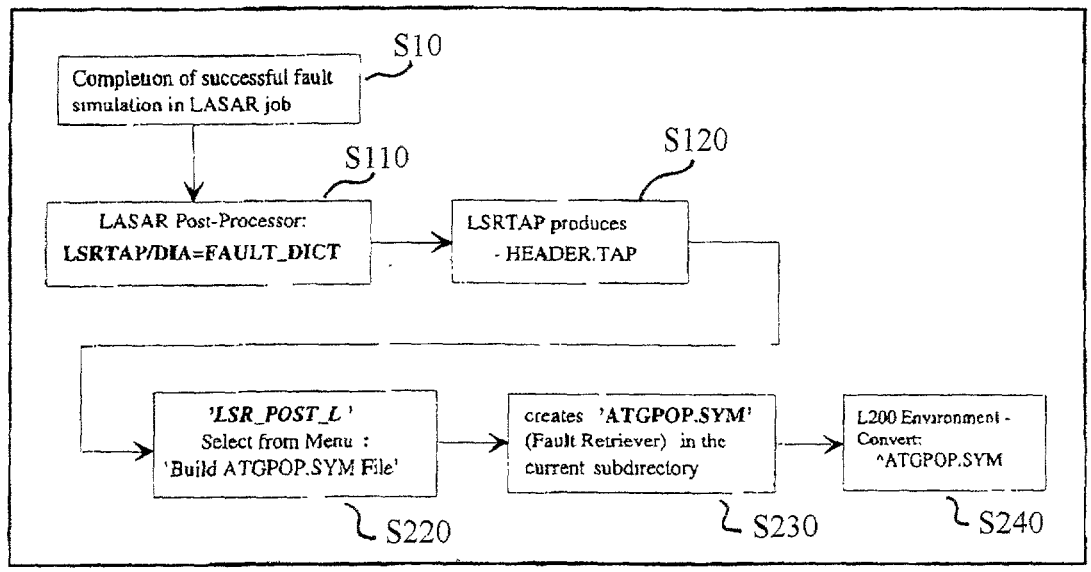
FIG. 4 is the creating of the run-time fault retriever.

Next, referring to FIG. 4, a user creates the fault retriever file 'ATGPOP.SYM' file (S230) for the L200 by running that option ("Build ATGPOP.SYM") from the main menu (S220). This file, too, must be converted into XEC (S240).

Figure 5:
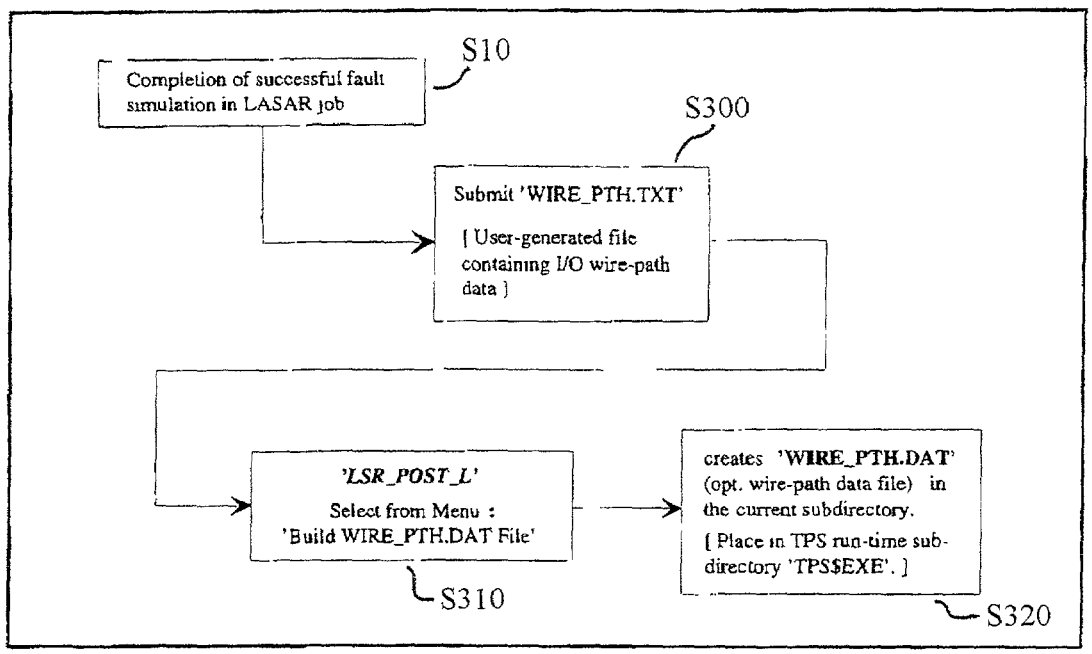
FIG. 5 is the creating of the optional wire-path file.

Finally, referring to FIG. 5, the optional "wire paths file," is created if desired. The "wire paths file" is a text file called 'WIRE_PTH.TXT' and is created using any text word editor. The "WIRE_PTH.TXT" file is submitted (S300). This file associates main net pin I/O (input/output) with cable or connector or both cable and connector information; it also offers the feature to associate a page number of a schematic to the main net I/O pins. Then, run 'LSR_POST_L' again and select the main menu option "Build WIRE_PTH.DAT File" (as seen in FIG. 5) (S310). LSR_POST_L creates the WIRE_PTH.DAT file which is the wire path data file in the current subdirectory (S320). The file resides in the test program run-time directory and not in the L200. The LSR_POST_L compiles the file to a run-time file for the tester (CASS workstation). FIG. 6 discloses the format of this wire path text file.

All of these main menu options may be run at once, if the test engineer wishes to do the whole job at once. For example, at the main menu, simply type in each option number delimited by commas. 'LSR_POST_L' will run the options selected in the order they are input.

The output files 'FAULT_D.DAT' and 'WIRE_PTH.DAT' 20 are transported 30 to the TPS (test program set) run-time directory. The test program set contains all of the software and hardware excluding the tester (i.e., interface device, miscellaneous cables, etc.). The files for the L200 test vectors, fault dictionary, new pinmap, wire paths, and fault retriever can be transported through a data line or an optical disc that is carried from one system to another. At this point, all files created by LSR_POST_L must now reside on the tester (CASS workstation), either in the run-time directory or in the L200 (XEC) environment as described above. Then the run-time fault analyzer 'ATG_FLT_L' 100 is brought in. One must be sure to convert the new pinmap file, all of the newly generated pattern files, and 'ATGPOP.SYM' into XEC as described above. The test engineer must supply all L200 timing and levels parameters as well as the other L200 files such as the cross reference and debug files.

There is an unlimited numbers of vectors in the creation of the fault dictionary. Further, there is test vector generation capability. The LSR_POST can accept very large jobs (32-bits will handle virtually unlimited size jobs) and create the test vectors needed for the L200 job at the CASS test station. The tester (CASS Workstation) houses the digital tester L200 and will run the digital test using the files generated above. It will accept the developer's own pin groups and create the test vector files written in the verbage of those pin groups using the syntax of the L200. The individual digital state for each pin group is shown for every pattern. Since L200 can only accept a limited number of bytes per file, the new 32-bit version monitors the size of each file & creates the quantity of files to accommodate this limitation.

Concerning the problems of hierarchical modeling, with this new post-processing duet, testing IDs and other boxes (WRAs, LRUs) is now easily implemented. The MSL variable in 'LSR_POST_L' in the "Build FAULT_DICTIONARY" option permits the test engineer to set the depth to which he has modeled.

For instance, there was the use of a two-card ID. A net for each of the cards, a net for output buffering (to accommodate LASARs insistence that wired nets never cross scope boundaries, a fault simulation requirement), and a net for some pull-up resistors (see FIGS. 8 and 9) were created. These were each pre-compiled in LASAR and then referenced as components in the main ID net. It was desired that the fault call-out go down to the secondary net level, ie. call out faulty components on each of the sub-nets. So, the MSL was set to two thus permitting fault callouts such as 'A1A2.U17', where U17 is a component on the A2 board in the ID A1.

The standard test language ATLAS will run the L200 tests. ATLAS requests execution of the patterns in the L200, and makes the L200 take and evaluate the response. ATLAS checks to see if the L200 found a fault on the circuit being tested. If a fault is found, then ATLAS calls ATG_FLT_L which is the second program of the duet and is only callable from ATLAS. ATG_FLT_L looks at the fault dictionary (fault_dictionary) that was previously created and compares its entries to the fault "snapshot" just taken on the faulty board being tested. ATG_FLT_L uses algorithms to decide which entry in the database most closely resembles or matches the real-world, run-time fault scenario just found. ATG_FLT_L sends back to ATLAS all of the information on the best four matches (best scoring are those that have the fewest mismatches). ATLAS then prints out for the operator the four possibilities of what it thinks actually failed in the real world scenario, i.e. the test just performed.

All test programs executed on the CASS are written in the standard test language of ATLAS. The ATLAS test program calls all testing operations at run-time. The functions of ATLAS and ATG_FLT_L are stated in more detail below. Typically, for all digital tests, ATLAS must interface with the L200 through Functional Extension Programs (FEP) which run in the background. The special FEP, 'L2_LASAR', normally used to launch LASAR-type digital tests, is not used with this new scheme. The test pattern generator of 'LSR_POST_L' creates the working L200 pattern files, a quantity of which is needed to accommodate the XEC compiler. At run-time, the first pattern file will call, in succession, the remaining pattern files. Following the last pattern file, it will call an L200 routine 'get_popats' (POPAT, primary output patterns) contained in the file 'ATG-POP.SYM' generated by 'LSR_POST_L' also. If failures were found, 'get_popats' will create a file in the TPS directory called 'popats.dat'.

The ATLAS calls the first pattern file in the L200 using the standard FEP 'L2_EXECUTE'. When the patterns have been executed, control goes back to the ATLAS. The ATLAS then tests for failures using the variable 'TEST-FAILED' that is returned from the FEP. If failures occurred, ATLAS then calls the new FEP 'ATG_FLT_L', the run-time fault analyzer of the duet. 'ATG_FLT_L' examines the 'popats.dat' file just created, matches the signature there with those in the fault_dictionary and returns the best matching faultsets with scores to the ATLAS.

As seen in FIG. 7, to use the FEP 'ATG-FLT-L', simply send it the name of the fault_dictionary file ('FAULT_D.DAT' used here) and the name of the optional wire paths file ('WIRE_PTH.DAT' shown here) or 'NONE', if not used. The FEP will send back the quantity of faultsets (maximum of four of the best scoring) it has compiled, the scores for each faultset, the print strings for each faultset, a small character array containing "news" relating the quality of the match, faultset information (not used), and lastly, the wire path callouts. The ATLAS procedure 'SHOW_ATG_FAIL' is offered here to demonstrate how the returned data is used to produce the fault callout on the display. The first parameter in this procedure just enables output to the printer, the second enables the wire paths to be displayed or printed or both displayed and printed.

Figure 8:
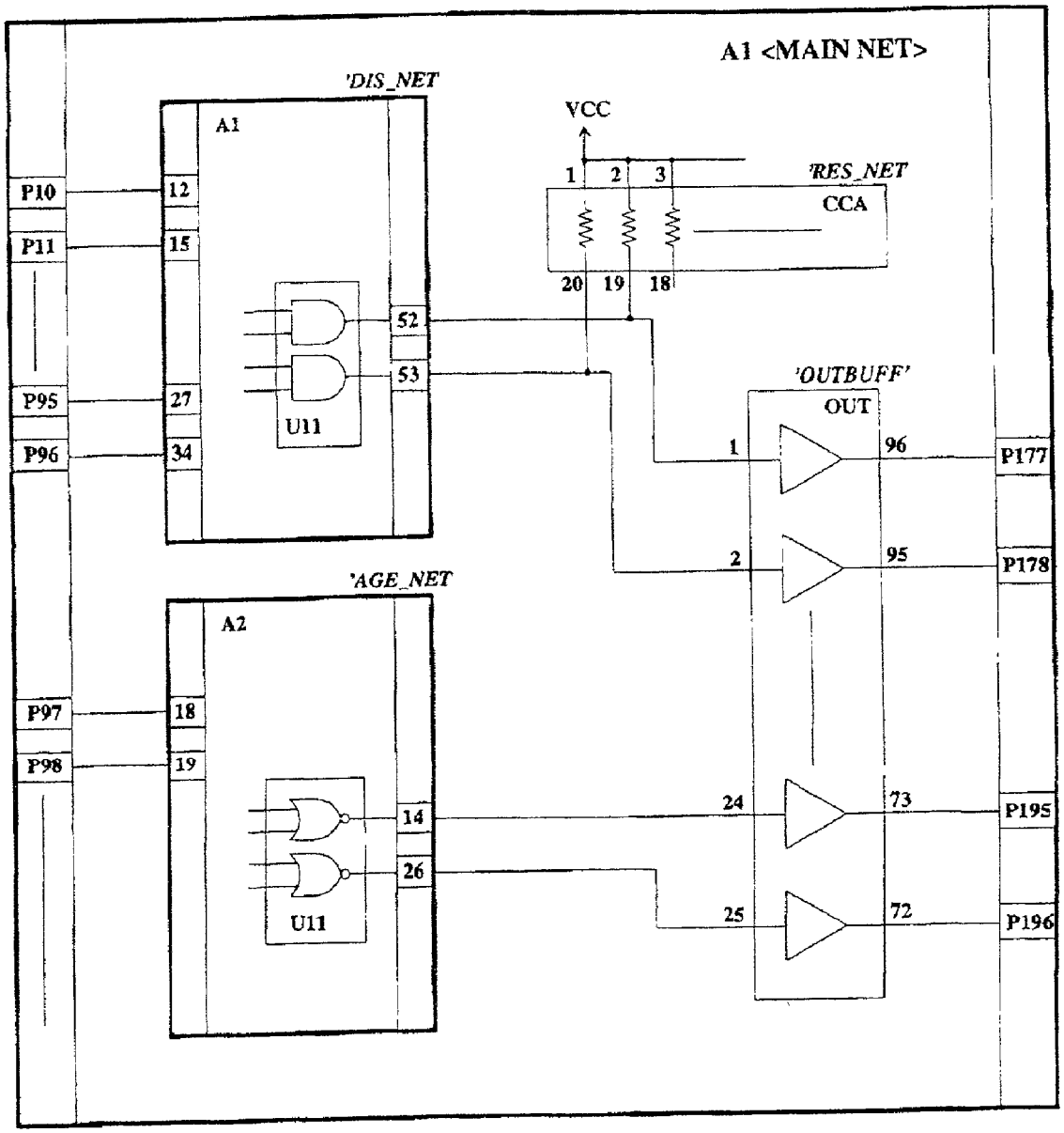
FIG. 8 is an example of hierarchical modeling.
Figure 9:
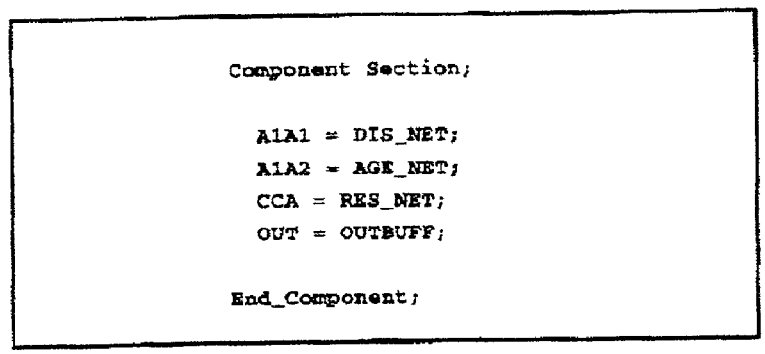
FIG. 9 is hierarchical modeling in LASAR.

Often the test engineer needs to build two or more nets and combine them into one large model, i.e. build a hierarchical LASAR model. LASAR permits this feature but post-processing into L200 is difficult if not prohibitive. The L200 post-processor does not allow names of chips to exceed four characters which precludes the use of scoping type fault callouts required by hierarchical modeling. With this new post-processing duet, testing IDs and other boxes (WRAs, LRUs) is now easily implemented. The MSL variable in 'LSR_POST_L'in the "Build FAULT_DICTIONARY" option permits the test engineer to set the depth to which he has modeled. As seen in FIGS. 8 and 9 an example of hierarchical modeling using LASAR is given.

There is a need that hierarchical schemes report the wire paths from the panel interface to the main net I/O and show a page number of a schematic where the I/O and wire path can be found. Rather than try to build all of this into some clunky model scheme using pseudo components, this new method allows the test developer to submit a wire path text file containing sections for the page numbers and the I/O association. 'LSR_POST_L' then converts the data in this file into a special wire-paths file which is accessed at run-time by 'ATG_FLT_L'. These wire-paths and schematic page numbers are correlated by 'ATG_FLT_L' when a fault is discovered and appended to the fault callout which is then printed by the ATLAS. Thus a full-bodied LASAR test for the system of boards is implemented.

Figure 11:
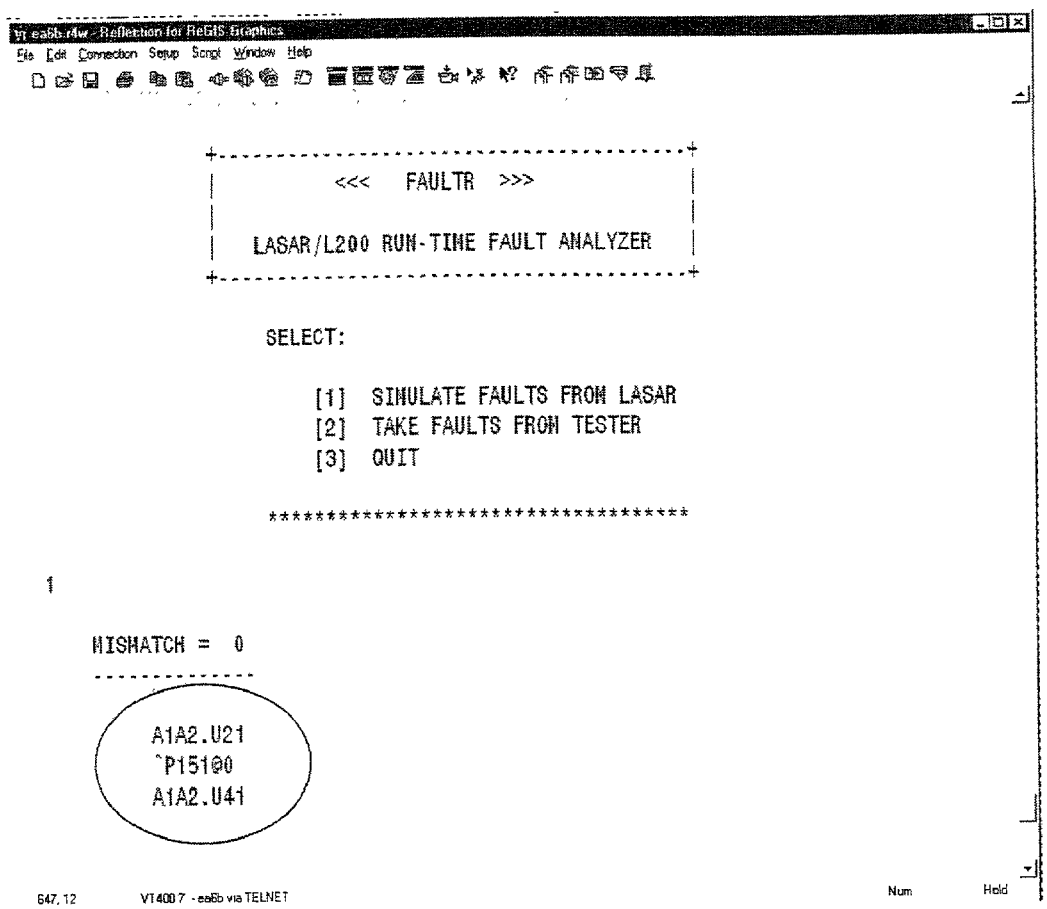
FIG. 11 is the output of the run-time fault analyzer.

Another feature of the duet method is an enhanced method of scoring mismatch between predicted test responses and actual tester responses. The 9-9-1 weighting factor method of mismatch scoring sometimes punishes the real fault signature too severely by overlooking valid matches. Furthermore, the 9-9-1 method has great difficulty handling anomalies such as multiple faults or poor initialization. Because of this, an alternative algorithm which is not based upon the standard 9-9-1 weighting factors was developed. This new algorithm instead offers partial credit for significant Primary Output Patterns (POPAT) that are actually detected. Rather than punishing deficiencies in the fault signature, tester POPATs are positively valued for the matches found. This results in a far better picture of the needed replacement action to repair the board or box. Most faults result in a mismatch of zero but the occasional anomaly such as discussed above is redemptively handled. The mismatch may be higher than ideal but, at least typically the faulty component is shown for repair action. For example, an easy fault inserted was not correctly diagnosed using prior techniques of 9-9-1 weighting factors. In fact, the actual fault <A1A2.U21>9@0 inserted was never mentioned in the output. As seen in FIG. 11, however, 'FAULTR' of the present invention, a troubleshooting version of 'ATG_FLT_L' caught the fault without problem.

FIG. 10 shows the roles of 'LSR-POST_L' 10 and 'ATG_FLT_L' 100. This duet post-processor and run-time fault analyzer offers a streamlined method of converting LASAR output to a run-time L200 job. Ease of use, eliminating the $CHAR_LIB and other files, is but one of the features of this duet. Very readable test vectors, both stimulus and response, using the engineer's own pin groups is another advantage of the present invention. Additionally, the programs facilitate the simple use of hierarchical LASAR modeling of boxes and enhance this by offering the addition of the wire-paths in the fault callouts as well as schematic page numbers for the repair action.

Figure 12:
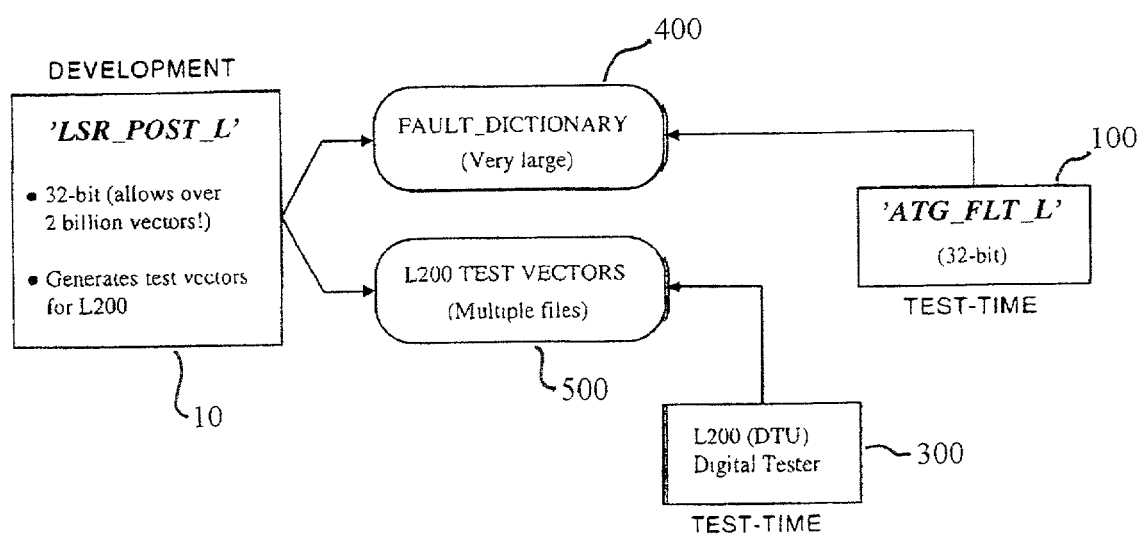
FIG. 12 is a view of the LSR_POST_L and ATG_FLT_L.
Figure 13:
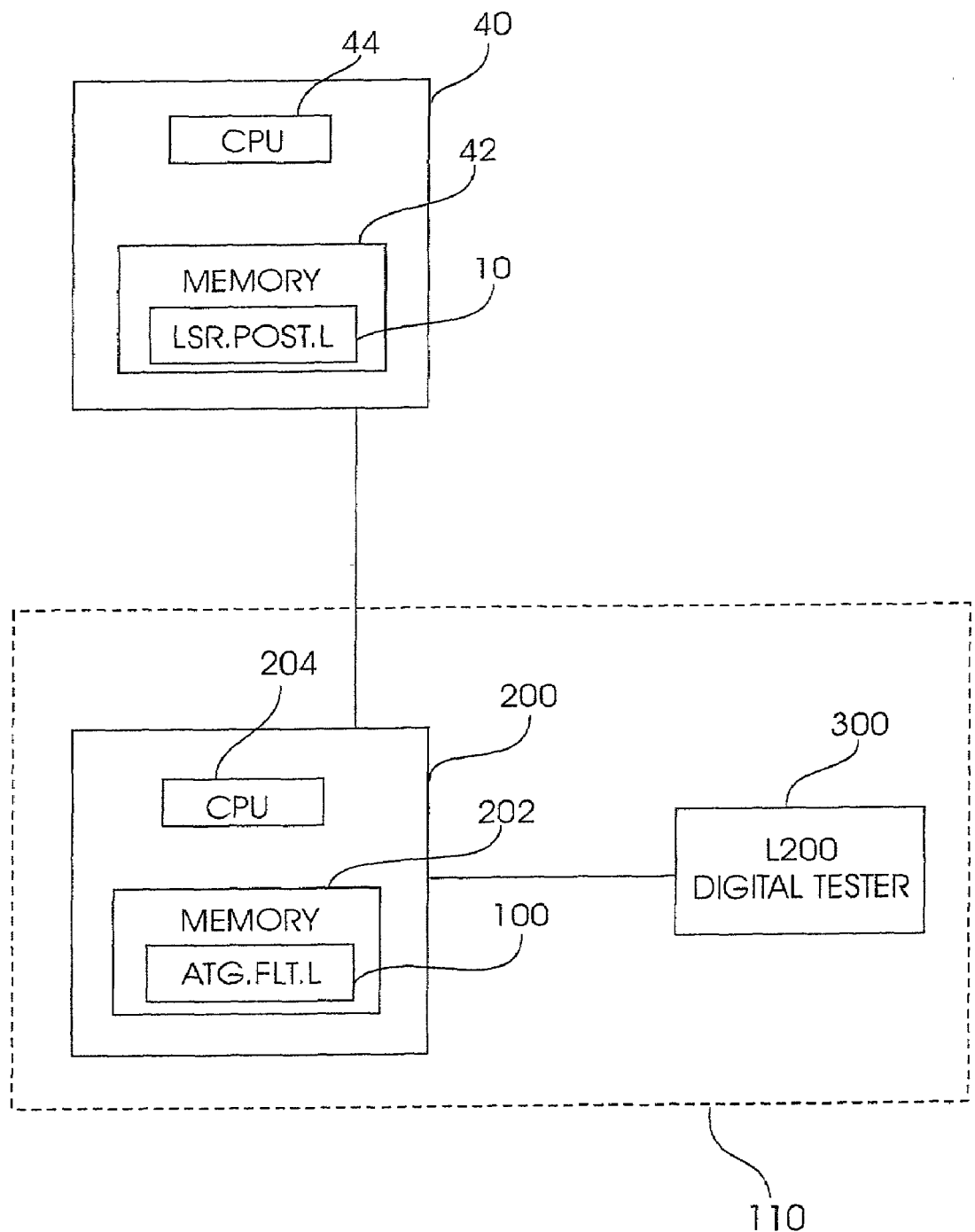
FIG. 13 is another view of the LASAR to L200 conversion.

FIGS. 10 and 13 show the LSR_POST_L 10 running on the memory 42 of a computer 40 with LASAR having a central processing unit 44. The computer 40 with LASAR may be connected to a computer 200 of the CASS test station 110 having a program ATG_FLT_L 100 on the memory 202 and including a central processing unit 204. The computer 200 may be connected to an L200 digital tester 300. As seen in FIG. 12, a fault dictionary 400 and L200 test vector files 500 can be generated.

As shown above, the present invention provides a multi-featured program duet for streamlining LASAR output into L200 test code and fault dictionary for digital program on CASS. The efficiency of converting the output of circuit simulation data into data for automated circuit testing program of a circuit testing device has been increased by the present invention. The programs generate readable test vectors and accommodate hierarchical model structuring. The mismatch scoring algorithm has also been enhanced.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A method, comprising the steps of:
completing a LASAR fault simulation on electronic circuitry resulting in output, including a fault dictionary and pattern files, being in a first computer language;
converting the output into a second computer language, readable by an L200 electronic circuitry tester system, by:
processing the output without the fault dictionary to generate files representing pin states for each pin of the electronic circuitry;
generating a pin map of the electronic circuitry and appending any pin groups;
running a program to generate new pattern files and a new pin map, from the pin map, pattern files, and files representing pin states, that are readable in the second computer language;
processing the fault dictionary from the fault simulation to reside in a run-time test program directory;
inputting a minimum scope level of analysis of the circuitry into the processed fault dictionary;
generating a fault retriever file usable by the L200 electronic circuitry tester system; and
transporting the processed fault dictionary, new pattern files, new pin maps, and fault retriever file to the L200 electronic circuitry tester system, accommodating run-time fault analysis.

2. The method of claim 1, further comprising the steps of:
generating wire paths in a text file; and
processing the wire paths in a text file to generate wire paths in a data file; and,
transporting the wire paths data file into a run-time test program directory.

3. The method of claim 2, wherein the wire path data file associates net pin input and output with cable and connector information and associating page numbers of a schematic to main net input and output pins.

4. The method of claim 3, further comprising the step of:
processing the new pattern files.

5. The method of claim 4, further comprising the steps of:
testing for failures;
calling a run-time fault analyzer when there is a failure; and,
creating a failure storage file.

6. The method of claim 5, further comprising the steps of:
examining the failure storage file according to a signature in the processed fault dictionary; and
returning best matching faultsets with scores.

7. The method of claim 2, further comprising the steps of:
sending the name of the processed fault dictionary and the name of the wire paths file or a signal of no wire paths file to be processed; and
generating faultsets, the scores for each faultset, the print strings for each faultset, an array including information of the quality of the match, and wire path callouts when wire paths have been selected.

8. A method, comprising the steps of:
completing fault simulation on electronic circuitry resulting in output, including a fault dictionary and pattern files, being in a first computer language;
converting the output into a second computer language, readable by an electronic circuitry tester system, by:
processing the output without the fault dictionary to generate files representing pin states for each pin of the electronic circuitry;
generating a pin map of the electronic circuitry and appending any pin groups;
running a program to generate new pattern files and a new pin map, from the pin map, pattern files, and files representing pin states, that are readable in the second computer language;
processing the fault dictionary from the fault simulation to reside in a run-time test program directory;
inputting a minimum scope level of analysis of the circuitry into the processed fault dictionary;
generating a fault retriever file useable by the electronic circuitry tester system;
transporting the processed fault dictionary, new pattern files, new pin maps, and fault retriever file to the electronic circuitry tester system, accommodating run-time fault analysis; and,
scoring a mismatch between predicted test responses and actual tester responses by assigning a partial credit for primary output patterns being detected.

9. An apparatus using output from a LASAR simulation of digital circuitry, including test vectors and a fault dictionary, in a first computer language, comprising:
an L200 testing unit for the digital circuitry accommodating run-time fault analysis of the digital circuitry using a second computer language;

a pin map generated for the L200 testing unit; and, a computer program to convert the test vectors into new test vectors in the second computer language, to process the fault dictionary, inputting a minimum scope level, to reside in a run-time test program directory, and to generate a fault retriever file wherein the new test vectors, processed fault dictionary, and fault retriever file are used by the L200 testing unit for run-time fault analysis on the digital circuitry.

10. The apparatus of claim 9, further comprising the computer program generating wire paths in a data file from a manually generated text file.

11. The apparatus of claim 10, further comprised of the wire path data file associating net pin input and output with cable and connector information and associating page numbers of a schematic to the main net input and output pins.

12. The apparatus of claim 11, further comprised of the computer program generating a file including failures by generating pattern files by a test pattern generator of the computer program and getting primary output patterns from the fault retriever file after the last pattern file is generated.

13. The apparatus of claim 12, further comprising the testing unit testing for failures and calling a second computer program when there is a failure.

14. The apparatus of claim 13, further comprising the second computer program examining the primary output pattern files according to a signature in the processed fault dictionary and returning best matching faultsets with scores to the second computer program.

15. The apparatus of claim 14, further comprised of the second computer program executing when the name of the processed fault dictionary and the name of the wire paths file or a signal of no wire paths file is received.

16. The apparatus of claim 15, further comprising of scoring a mismatch between predicted test responses and actual tester responses from the testing unit through the second computer program by assigning a partial credit for primary output patterns being detected.

* * * * *